United States Patent
Strauss et al.

(10) Patent No.: US 6,733,641 B1
(45) Date of Patent: May 11, 2004

(54) MECHANICALLY JOINED SPUTTERING TARGET AND ADAPTER THEREFOR

(75) Inventors: David P. Strauss, Glen Rock, NJ (US); Thomas J. Hunt, Peekskill, NY (US); Paul S. Gilman, Suffern, NY (US)

(73) Assignee: Praxair S. T. Technology, Inc., New Haven, CT (US)

( * ) Notice: Subject to any disclaimer, the term of this patent is extended or adjusted under 35 U.S.C. 154(b) by 0 days.

(21) Appl. No.: 08/881,948

(22) Filed: Jun. 25, 1997

Related U.S. Application Data

(62) Division of application No. 08/667,504, filed on Jun. 21, 1996, now Pat. No. 5,738,770.

(51) Int. Cl.⁷ .............................................. C23C 14/34
(52) U.S. Cl. ............................. 204/298.12; 204/298.13
(58) Field of Search ........................ 204/298.12, 298.13

(56) References Cited

U.S. PATENT DOCUMENTS

| | | | | |
|---|---|---|---|---|
| 3,630,881 A | * | 12/1971 | Lester et al. ............ | 204/298.12 |
| 4,820,397 A | | 4/1989 | Fielder .................. | 204/298.12 |
| 4,855,033 A | | 8/1989 | Hurwitt ................. | 204/298 |
| 5,009,765 A | | 4/1991 | Qamar et al. ........... | 204/298.12 |
| 5,066,381 A | | 11/1991 | Ohta et al. ............. | 204/298.12 |
| 5,112,467 A | * | 5/1992 | Zejda .................... | 204/298.12 |
| 5,143,590 A | | 9/1992 | Strothers et al. ....... | 204/298.12 |
| 5,147,521 A | | 9/1992 | Belli et al. ............. | 204/298.12 |
| 5,244,556 A | * | 9/1993 | Inoue .................... | 204/298.12 |
| 5,259,941 A | | 11/1993 | Münz ..................... | 204/298.09 |
| 5,269,403 A | | 12/1993 | Pouliquen et al. ...... | 204/298.12 |
| 5,529,673 A | | 6/1996 | Strauss et al. ......... | 204/298.12 |
| 5,641,389 A | | 6/1997 | Strauss et al. ......... | 204/298.12 |
| 5,738,770 A | * | 4/1998 | Strauss et al. ......... | 204/298.12 |

FOREIGN PATENT DOCUMENTS

| | | | | |
|---|---|---|---|---|
| JP | 59-170269 | * | 9/1984 | ............ 204/298.12 |
| JP | 59-179784 | * | 10/1984 | ............ 204/298.12 |
| JP | 2-285069 | | 11/1990 | ............ 204/298.12 |
| WO | 92-20831 | | 11/1992 | |

OTHER PUBLICATIONS

Tokyo Electron KK, *Sputtering Device Has Readily Replaceable Target*, English Abstract, Japanese Document 2–285069.

Murata Seisakusho KK, *Target For Sputtering*, English Abstract, Japanese Document 55–89471.

* cited by examiner

*Primary Examiner*—Rodney G. McDonald
(74) *Attorney, Agent, or Firm*—Iurie Schwartz

(57) ABSTRACT

A target assembly in which the sputtering material is not soldered or otherwise metallurgically bonded to a backing plate. Rather, the target, which is homogeneously manufactured of sputtering material, is mechanically coupled (e.g., with bolts) to an adapter, which is itself permanently affixed to the chamber. As a result, the target can be easily uncoupled from the chamber and replaced, without also requiring removal and replacement of a backing plate.

7 Claims, 4 Drawing Sheets

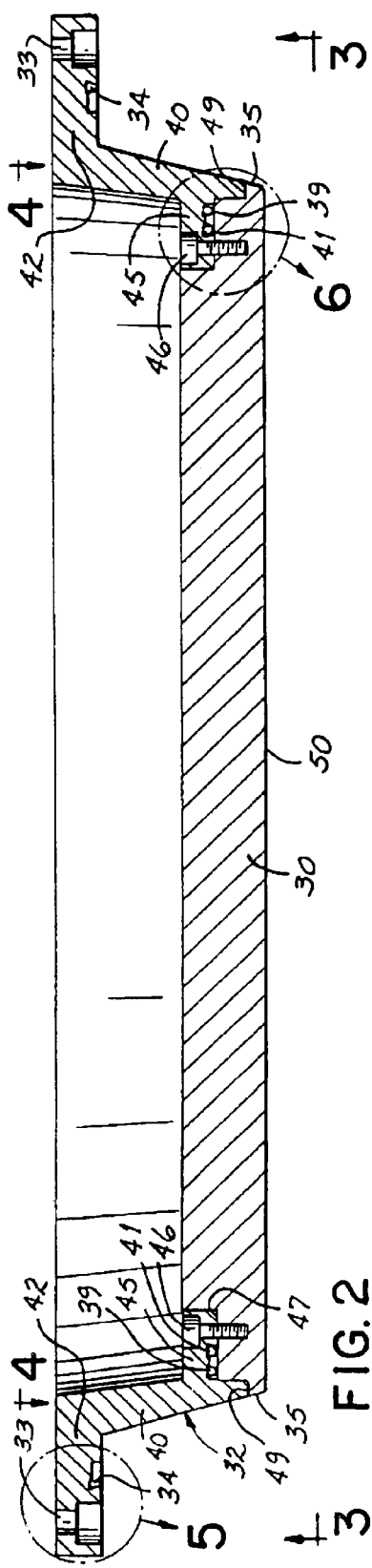
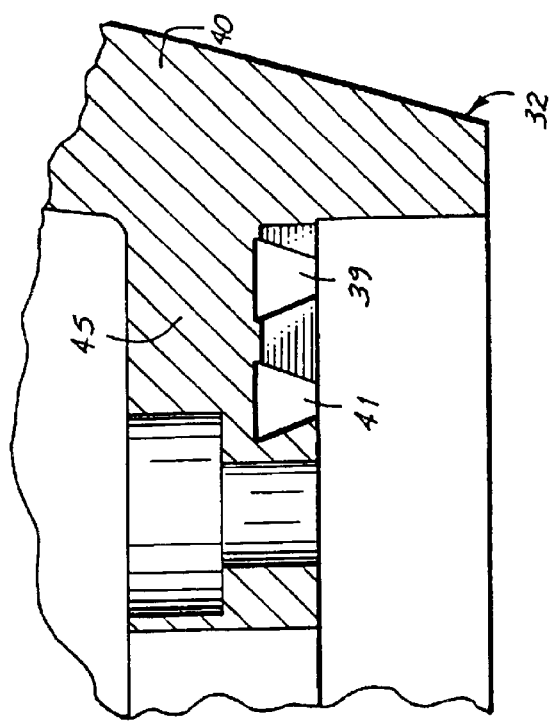
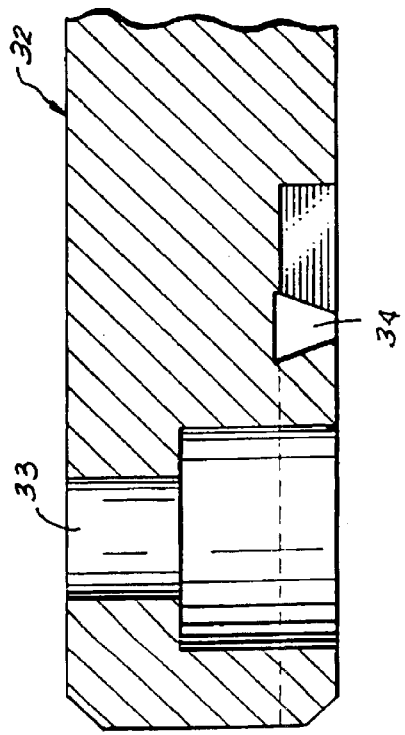

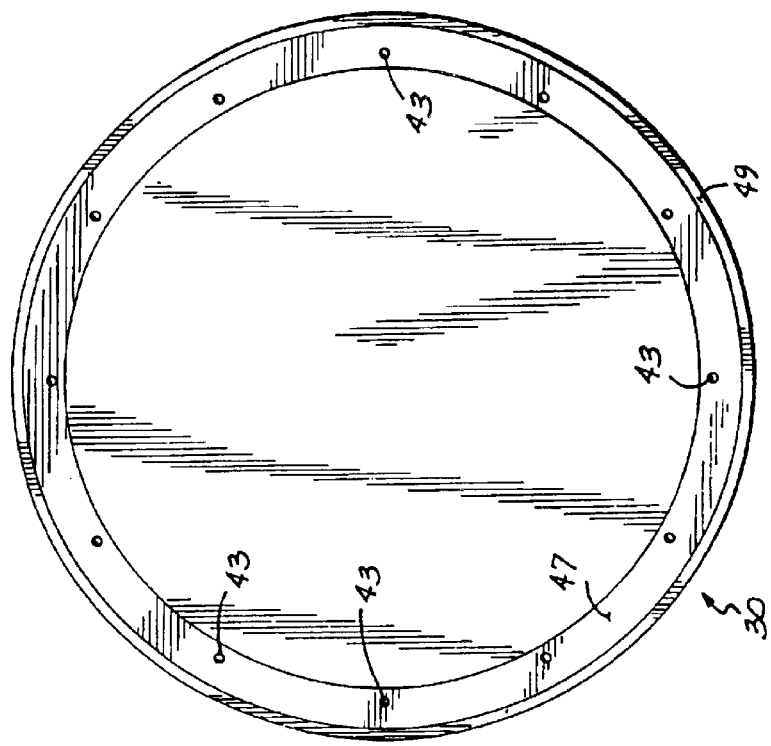
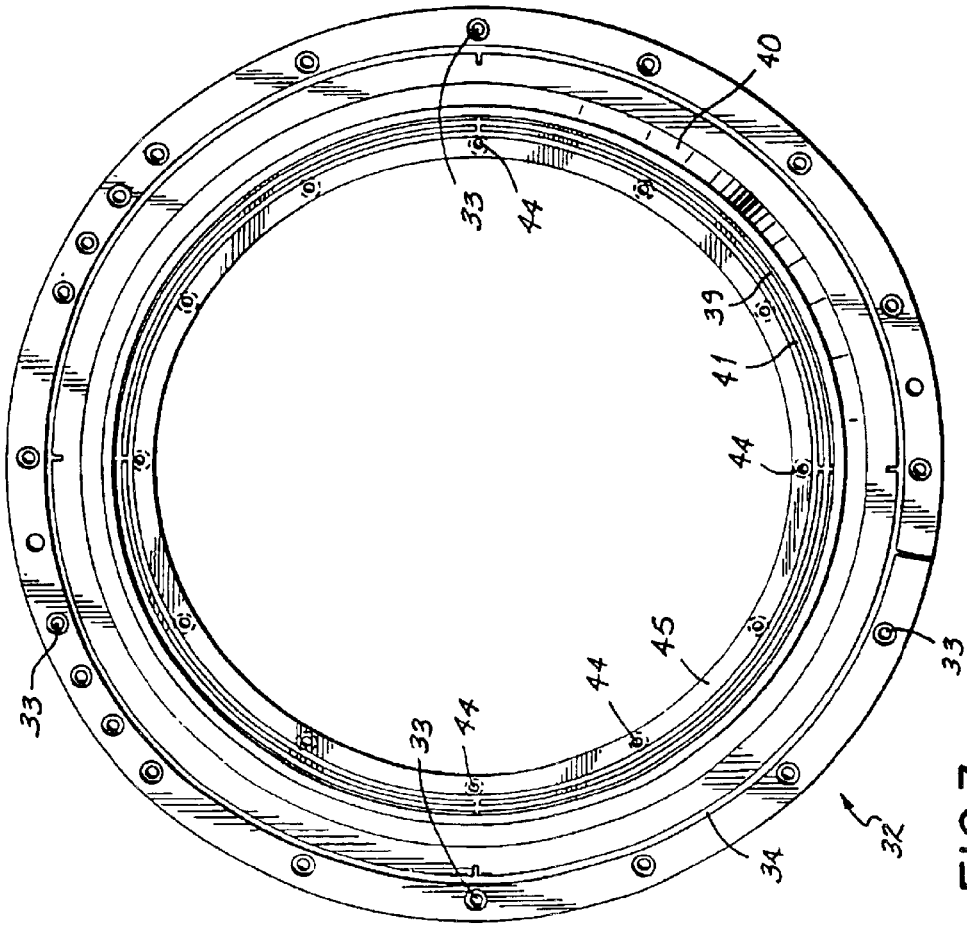
FIG. 4
FIG. 3

MECHANICALLY JOINED SPUTTERING TARGET AND ADAPTER THEREFOR

This is a divisional application of application Ser. No. 08/667,504 filed on Jun. 21, 1996, now U.S. Pat. No. 5,740,770 for MECHANICALLY JOINED SPUTTERING TARGET AND ADAPTOR THEREFOR.

CROSS REFERENCE TO RELATED APPLICATIONS

This application is related to previously filed, currently pending U.S. applications Ser. No. 08/390,662, filed Feb. 17, 1995 and a divisional thereof filed Apr. 23, 1996, both having the same title as this application and naming the same inventors, and incorporated herein by reference in their entirety.

FIELD OF THE INVENTION

This invention relates to targets for plasma sputtering apparatus.

BACKGROUND OF THE INVENTION

Sputtering processes are typically performed in a vacuum chamber. The chamber includes a target comprised of material, such as Aluminum, to be sputtered. A substrate, such as a semiconductor wafer bearing integrated circuits, is placed in the chamber and the chamber is evacuated. Once the chamber is evacuated, a process gas is introduced into the chamber at a low pressure, and a voltage is applied to the target. Ionized gas in the chamber is accelerated by the electric fields of the target. When the ions impinge upon the target, atoms of sputtering material are dislodged ("sputtered") from the target. The dislodged atoms deposit on the substrate, forming, over time, a thin film of target material on the substrate.

The sputtering process described above slowly wears material from the target until, ultimately, the target must be renewed. Typically, this is done by removing the target from the chamber and inserting a new target into the chamber.

FIG. 1 is a cross-sectional view of a typical vacuum chamber 10 for performing a sputtering process, and a target 12 mounted in this chamber. Chamber 10 is generally cylindrical or rectangular in shape, and target 12 is generally disk-shaped and mounts into a circular opening 13 in chamber 10. Wafer 14, which is disk-shaped, is supported inside of chamber 10 by a generally disk-shaped anode 16. Electrical power is applied to the anode 16 with respect to the remainder of the chamber 10.

As shown in FIG. 1, a typical target is manufactured of a backing plate 20 of a metal such as Copper, metallurgically bonded (e.g., soldered) to a target plate having a front face 22 of sputtering material. Backing plate 20 is affixed to a chamber cover 23 by mounting screws 24. Cover 23 is clamped to chamber 10 by means not shown, and supports the front face 22 in a position generally opposite wafer 14. An O-ring inserted into groove 26 prevents leakage into the chamber 10 through the target-chamber interface. During the sputtering process, material from front face 22 is removed and deposited on the wafer 14, while backing plate 20 remains in place.

Over time, a typical target such as that shown in FIG. 1 wears to the extent that the sputtering material on the front face 22 must be renewed. When this occurs, cover 23 is lifted from chamber 10, and target 12 is detached from cover 23 and removed. A new target 12 is then assembled to cover 23, and cover 23 is clamped onto chamber 10, and processing continues.

Backing plates are typically manufactured of expensive metals, and for this reason are typically recycled after use. Once a worn target has been removed from the cover 23, the backing plate and the remaining sputtering material soldered thereto, are returned to the manufacturer. The manufacturer removes the remaining sputtering material from the backing plate, and solders a new target plate having a front face 22 of sputtering material to the backing plate. The target 12, consisting of the recycled backing plate and new front face of sputtering material, is then ready for resale. To ensure that processing facilities promptly return used targets to the manufacturer, manufacturers typically include a core charge in the price of each target sold; this charge is refunded upon return of the used target to the manufacturer.

This process for recycling used targets is inconvenient in that it requires regular shipment of bulky and heavy targets back to the manufacturer. Furthermore, to ensure a sufficient stockpile of targets to avoid downtime, semiconductor fabrication facilities must retain in inventory a number of new targets 12, which involves essentially permanent payment of the core charges associated with the targets held in inventory.

SUMMARY OF THE INVENTION

In accordance with the invention, the above disadvantages are overcome by providing a target in which the sputtering material is not soldered or otherwise metallurgically bonded to a backing plate. Rather, the target is mechanically coupled (e.g., with bolts) to the chamber. As a result, the sputtering material can be easily uncoupled from the chamber and replaced, without also requiring removal and replacement of a backing plate.

Specifically, in one aspect the invention features an adapter sized for permanent mounting to the chamber at the same attachment points as the target shown in FIG. 1. The adapter has a central aperture in which the adapter supports a target. Mechanical couplers inserted through the adapter and the target mechanically join the target to the adapter. The target is manufactured homogeneously of sputtering material, and can be separately installed into and removed from the chamber without removing the adapter. As a result, when the target is worn, the target can be replaced without requiring refurbishing of the adapter.

In specific embodiments, the adapter, which may be of Copper, has a generally cylindrical shape, with generally cylindrical supporting walls, a generally radial outer flange sized for mounting to the chamber in place of the prior art target, and a generally radial inner flange for supporting the target. Apertures through the inner flange of the adapter receive the mechanical couplers, which may be bolts. The target, which is a single piece of machined material such as Aluminum or Aluminum Oxide, Titanium, Gold, refractory metals, or other self-supporting materials, has a disk shape, and has threaded apertures in one of its disk shaped surfaces, arranged in mating relation to the apertures in the inner flange of the adapter. Bolts inserted through the apertures in the adapter are threaded into the apertures on the target and thus couple the target to the adapter.

In further aspects the invention features a target having features described above, and a modified chamber integrally incorporating the adapter therein, thus avoiding the need for a separate adapter.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodi

FIG. 2 is a cross-sectional view of a target 30 and adapter 32 in accordance with principles of the present invention;

FIG. 3 is a plan view of adapter 32 as viewed along line 3—3 in FIG. 2, with target 30 removed;

FIG. 4 is a plan view of target 30 as viewed along line 4—4 in FIG. 2, with adapter 32 removed;

FIGS. 5 and 6 are detail views of FIG. 2 illustrating the O-ring grooves in the adapter of FIG. 2;

DETAILED DESCRIPTION OF SPECIFIC EMBODIMENTS

Referring to FIGS. 2–5, a target assembly in accordance with principles of the present invention includes a target 30 of sputtering material, for example, Aluminum or Aluminum Oxide, Titanium, Gold, refractory metals, or other self-supporting materials. This target 30 is mechanically joined to an adapter 32. The completed assembly of target 30 and adapter 32 has the same shape as the prior art target shown in FIG. 1.

Target 30 is a substantially disk-shaped plate manufactured of sputtering material such as Aluminum or Aluminum oxide, Titanium, Gold, refractory metals, or other self-supporting materials. Adapter 32 is manufactured of a metal suitable for supporting target 30 against vacuum pressure in chamber 10. Materials currently used in target backing plates such as Copper are suitable for this purpose.

Figure 1:
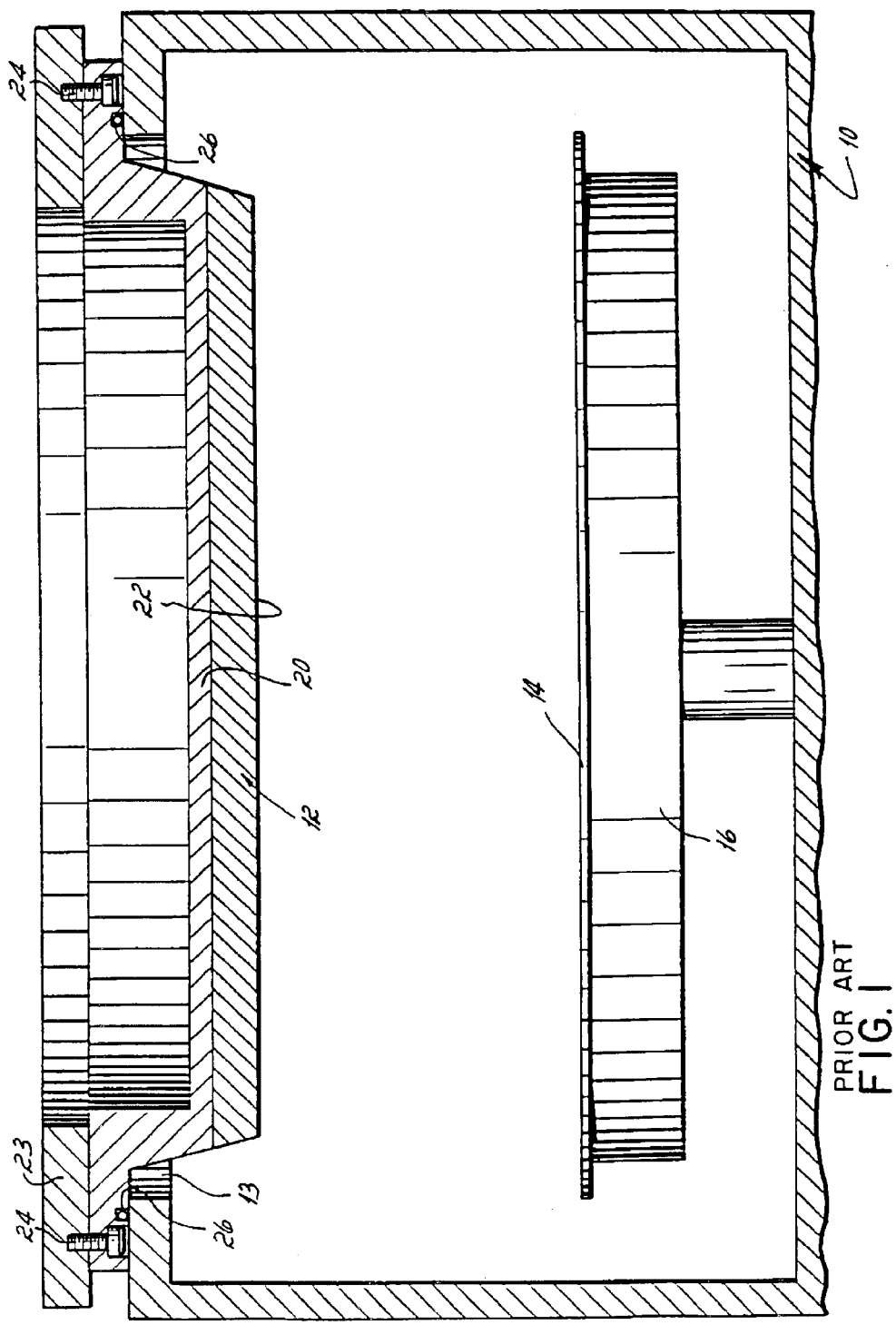
- FIG. 1 is a cross-sectional view of a sputtering target and chamber in accordance with the prior art.

Adapter 32 is mounted to cover 23 of chamber 10 (see FIG. 1) using bolts inserted through apertures 33, in the same manner as the prior art target shown in FIG. 1. Apertures 33 have the same position and diameter as those found in the prior art target shown in FIG. 1. Further, adapter 32 includes a groove 34 having, the same location and size as groove 26 in the prior art target shown in FIG. 1. Groove 34 holds an O-ring of the same size as that held in groove 26, thereby preventing leakage into the chamber through the interface of the adapter 32 and the chamber 10.

The diameter of target 30 across its outer periphery 35 is approximately 11.39 inches. The thickness of target 30 is approximately 0.74 inches, and the thickness of the complete assembly of target 30 and adapter 32, shown in FIG. 2, is approximately 1.91 inches. These dimensions are exactly compatible with those of the prior art target shown in FIG. 1.

Adapter 32 includes a cylindrical supporting wall 40 having a outer radial flange 42 extending outwardly therefrom to mate to the chamber, and an inner radial flange 45 extending inwardly therefrom to support the target 30. Inner radial flange 45 extends radially inward approximately 0.65 inches, providing a sufficient support for target 30.

Target 30 includes a radially inward step 47 of approximately 0.65 inches, positioned to mate with the inner radial flange 45 of the adapter 32. Target 30 further includes a second radially inward step 49 of approximately 0.14 inches, positioned to extend over the cylindrical supporting wall 40 to prevent sputtering from the adapter 32.

As best illustrated in FIG. 6, adapter 32 includes, along inner flange 45, two grooves 39 and 41 approximately 0.13 inches wide, suitable to receive two O-rings. O-rings create a tight seal between target 30 and adapter 32, and thereby reduce leakage into the chamber through the interface between target 30 and adapter 32. Referring to FIG. 6, the walls of grooves 39 and 41 are "dovetailed", i.e., are sloped inwardly to capture an O-ring inside of the groove. A double sloped wall, such as shown in FIG. 6, or a single sloped wall, may be used.

As also seen in FIG. 5, outer flange 42 of adapter 32 also includes a groove 34 for capturing an O-ring to prevent leakage into the chamber from between adapter 32 and the chamber.

As best seen in FIG. 4, target 30 includes, at various spaced locations along radial step 47, threaded apertures 43, which are approximately 0.33 inches in depth and sized to receive 8–32 bolts such as 46 (FIG. 2). As best seen in FIG. 3, adapter 32 includes, in inner flange 45, apertures 44 at spaced locations corresponding to apertures 43 in target 30. In one embodiment, there are twelve such apertures radially evenly spaced around the inner flange 45 and step 47, of adapter 32 and target 30, as seen in FIGS. 3 and 4.

In use, adapter 32 and target 30 are attached to cover 23 of chamber 10 in the manner shown in FIG. 1. To mechanically join target 30 to adapter 32, grooves 39 and 41 are loaded with suitably sized O-rings. Next, target 30 is inserted into adapter 32, such that apertures 43 in target 30 are in alignment with apertures 44 in adapter 32. Next, 8–32 bolts 46 of suitable length, e.g., 0.5 inch, are inserted through apertures 44 and into apertures 43, engaging the threads of apertures 43. The bolts 46 are then torqued to a sufficient level to form a seal between target 30 and adapter 32.

To assist the user in properly aligning target 30 to adapter 32, target 30 may include, at one or more locations along its outer periphery, a pin, which mates with one or more slots in adapter 32 to align the apertures 43 and 44 of target 30 and adapter 32. Other combinations of mating features can be used to facilitate alignment, such as, for example, a protrusion in the step 47 of the target which mates to a slot in the inner flange 45 of the adapter 32.

In use, target 30 is installed to adapter 32, and then adapter 32 is installed to cover 23 of chamber 10 (see FIG. 1) in the same manner as the prior art target of FIG. 1. Sputtering is performed from surface 50 of target 30 until excessive wear requires replacement of target 30. At this point, adapter 32 and target 30 are removed from cover 23, and then the bolts 46 holding target 30 to adapter 32 are extracted, and target 30 is removed from adapter 32. Then a new target 30 received from the manufacturer is attached to adapter 32 in place of the worn target 30, and the new target 30 and adapter 32 are again mounted to cover 23.

An advantage of this process is that the worn target 30 need not be returned to the manufacturer for recycling. Rather, the target material may be disposed or recycled as scrap metal. Thus, in accordance with principles of the present invention it is not necessary to repeatedly return worn targets to the manufacturer for refurbishing. Furthermore, it is not necessary for the manufacturer to make a core charge to ensure timely return of worn targets to permit recovery of backing plates.

Another potential advantage of the invention is increased target life. There are two factors limiting the amount of wear that target 30 can undergo before replacement is required.

First, target 30 must be self-supporting; that is, target 30 bears the stress of vacuum pressure in the chamber without support from a backing plate as is found in the prior art target of FIG. 1. It has been found that a target manufactured of Aluminum or Aluminum Oxide has sufficient stiffness to support this stress, at least until the target has worn to the point that the thickness of the target in its central section is approximately equal to the thickness of the backing plate 20 shown in FIG. 1.

Second, referring specifically to FIG. 3, at the outer periphery 35 of target 30, there is a thickness of approximately 0.16 inches of sputtering material, formed by step 49, which overlays adapter 32, and a thickness of approximately 0.11 inches of sputtering material overlaying aperture 43. Wear in this area of the target will eventually expose adapter 32 or the aperture 43 (and the bolt 46 holding target 30 to adapter 32). However, it has been discovered that the rate of wear of target 30 on surface 50 is most rapid in the area of the target 30 nearest to its central axis. Some wear occurs near to the periphery of the target; however, the proportionate rate of wear at the center of the target is such that the target must be replaced due to wear in the central region well before there is any exposure of aperture 40 or adapter 32.

It appears that the target 30 shown in FIGS. 2 and 4 may provide a longer term of use than the prior art target shown in FIG. 1. In the prior art target shown in FIG. 1, wear cannot proceed beyond the point where the solder bond between the target and backing plate is exposed, since contamination would result. In fact, target use must halt some time before the solder bond is exposed to provide a margin for error. By contrast, in the target 30 shown in FIG. 2, the allowable amount of wear is not limited by the presence of a solder bond, but only by the requirement that the target remain self-supporting. It has been found that target 30 can remain self-supporting even though target 30 has been worn to an extent that would have exposed the solder bond in the target of FIG. 1. Therefore, it appears that the target 30 in accordance with the invention may provide a longer life than the prior art structure shown in FIG. 1.

Figure 7:
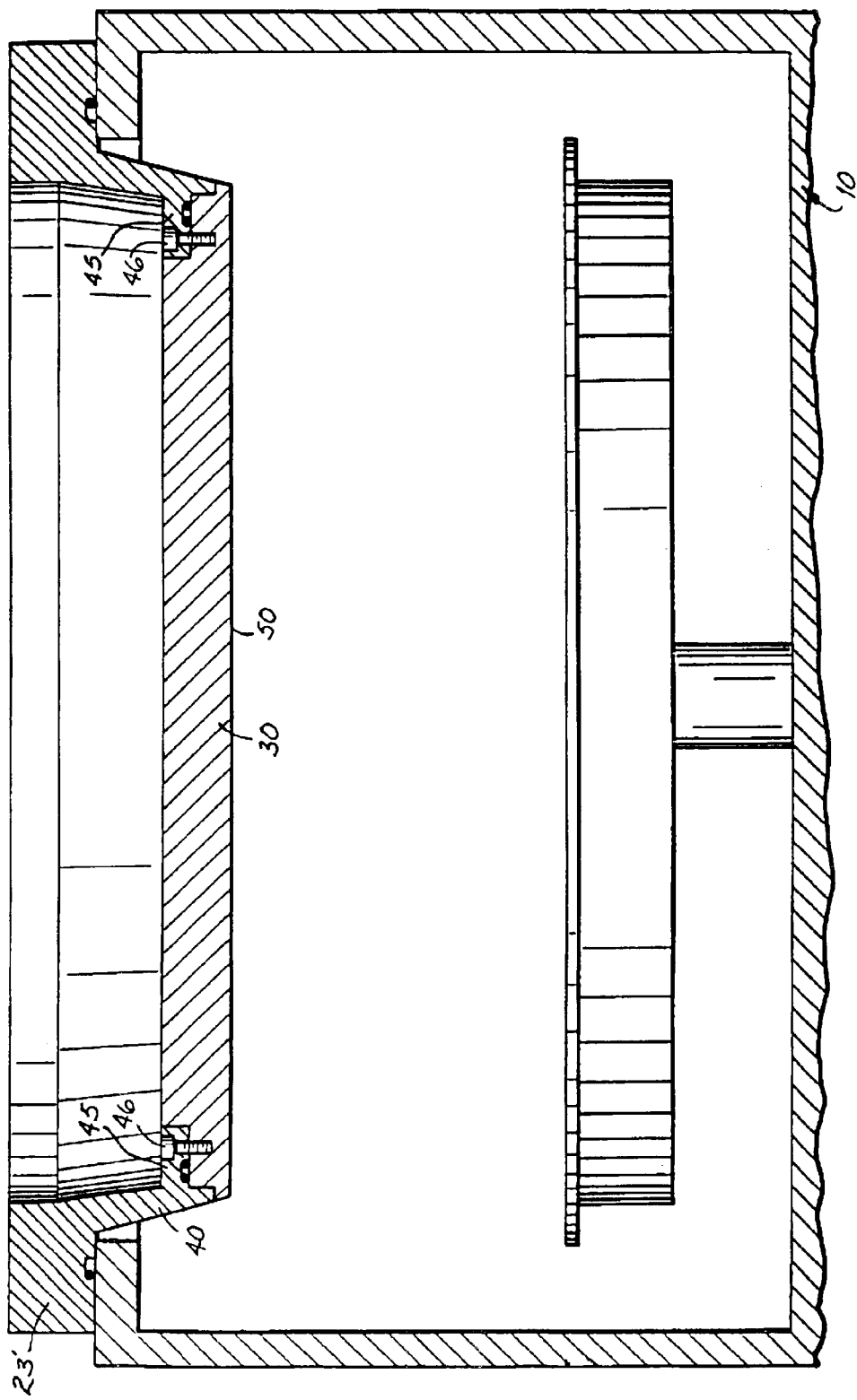
FIG. 7 is a cross-sectional view of a chamber FIG. 1 having a door modified to permanently incorporate the structure of the adapter of FIG. 3, and a target attached thereto.

Now referring to FIG. 7, in an alternative embodiment of the present invention, chamber cover 23' of the prior art structure shown in FIG. 1 is modified to incorporate the structure of adapter 32, by incorporating therein cylindrical supporting wall 40, inner flange 45, and the other features discussed above. In accordance with this modified structure, there is no need for a separate adapter, as targets 30 may be directly mounted to the modified chamber cover 23'.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A target for installation in a vacuum chamber for processing a substrate by causing sputtering material to be ejected from the target onto said substrate, comprising a disk-shaped section having two planar surfaces and on outer periphery, said disk-shaped section having at least one radially-inward step proximate said outer periphery, a continuous ring configured backing plate with an adapter having an inner radial flange having at least one groove therein to accommodate an o-ring, said radial flange being disposed in a mating relationship with said radially-inward step thereby preventing leakage into said vacuum chamber at the interface of said adapter and said vacuum chamber, said target being manufactured homogeneously of said sputtering material, and said disk-shaped section defining threaded holes proximate said outer periphery of said disk-shaped section.

2. The target of claim 1 wherein said disk-shaped section is sufficiently self-supporting to bear stress arising when said section is mounted to said vacuum chamber supported only proximate said outer periphery, and said chamber is evacuated to initiate sputtering, such that one planar surface of said section is exposed to vacuum pressure while an opposite side thereof is not exposed to reduced pressure.

3. The target of claim 1 wherein said sputtering material is a refractory metal.

4. The target of claim 1 wherein said sputtering material is one of Titanium, Gold, and Aluminum.

5. The target of claim 1 wherein said sputtering material is Aluminum or an oxide thereof.

6. The target of claim 1 wherein said disk-shaped section defines threaded holes opening into said at least one radially-inward step, proximate said outer periphery of said disk-shaped section.

7. The target of claim 1 wherein said disk-shaped section has two radially-inward steps proximate said outer periphery.

* * * * *